United States Patent
Takase

(10) Patent No.: US 7,651,927 B2
(45) Date of Patent: Jan. 26, 2010

(54) SEMICONDUCTOR DEVICE AND METHOD FOR FABRICATING THE SAME

(75) Inventor: Yuji Takase, Osaka (JP)

(73) Assignee: Panasonic Corporation, Osaka (JP)

( * ) Notice: Subject to any disclaimer, the term of this patent is extended or adjusted under 35 U.S.C. 154(b) by 430 days.

(21) Appl. No.: 11/604,751

(22) Filed: Nov. 28, 2006

(65) Prior Publication Data

US 2007/0170550 A1 Jul. 26, 2007

(30) Foreign Application Priority Data

Jan. 20, 2006 (JP) .............................. 2006-011969

(51) Int. Cl.
*H01L 21/20* (2006.01)
*C30B 23/00* (2006.01)
*C30B 25/00* (2006.01)
*C30B 28/12* (2006.01)
*C30B 28/14* (2006.01)

(52) U.S. Cl. .................. 438/479; 438/481; 257/94; 257/95; 257/96; 257/97; 257/E33.002; 257/E33.003; 257/E33.04; 257/E33.043; 117/94; 117/97; 117/106

(58) Field of Classification Search ................ 438/479, 438/481; 257/94–97, E33.002–E33.005, 257/E33.043; 117/913, 94, 90, 95, 106

See application file for complete search history.

(56) References Cited

U.S. PATENT DOCUMENTS

| 6,036,773 A | * | 3/2000 | Wang et al. ............... 117/97 |
| 2003/0087467 A1 | * | 5/2003 | Oohata et al. ............. 438/47 |
| 2005/0285132 A1 | | 12/2005 | Orita |

FOREIGN PATENT DOCUMENTS

| JP | 11-043398 | * | 2/1999 |
| JP | 2002-289540 A | | 10/2002 |
| JP | 2004-193371 | * | 7/2004 |
| JP | 2006-49855 A | | 2/2006 |

* cited by examiner

*Primary Examiner*—Ha Tran T Nguyen
*Assistant Examiner*—Karen M Kusumakar
(74) *Attorney, Agent, or Firm*—McDermott Will & Emery LLP

(57) ABSTRACT

A semiconductor device includes a substrate and a semiconductor layer formed on the substrate. The substrate has: a flat region provided in a main surface thereof; a first indentation region provided in a portion of the main surface different from the flat region and formed with first recesses; and a second indentation region provided between the first indentation region and the flat region, formed with second recesses, and having a lower probability of occurrence of growth nuclei than the first indentation region and a higher probability than the flat region in the case where a crystal of a semiconductor is grown on the main surface.

17 Claims, 8 Drawing Sheets

SEMICONDUCTOR DEVICE AND METHOD FOR FABRICATING THE SAME

CROSS-REFERENCE TO RELATED APPLICATIONS

This application claims priority under 35 U.S.C. § 119 on Patent Application No. 2006-011969 filed in Japan on Jan. 20, 2006, the entire contents of which are hereby incorporated by reference.

BACKGROUND OF THE INVENTION (a) Fields of the Invention

The present invention relates to semiconductor devices and their fabrication methods.

(b) Description of Related Art

In growing a semiconductor layer on a substrate, crystal growth of the semiconductor may be conducted on an indented surface of the substrate. For example, a crystal of a semiconductor layer is grown on a substrate with fine indentations, whereby the crystallinity of the formed semiconductor layer is improved. This provides a semiconductor device with excellent characteristics (see, for example, Japanese Unexamined Patent Publication No. 2002-289540).

For a semiconductor light emitting diode (LED), a photonic crystal having two-dimensionally periodic indentations in an emitting surface thereof can be provided to improve the light-extraction efficiency of the diode. The photonic crystal can be formed easily by growing a semiconductor layer on a substrate having two-dimensionally periodic indentations (see, for example, Japanese Unexamined Patent Publication No. 2006-049855).

SUMMARY OF THE INVENTION

However, the inventor found the fact that the following problems arise when the crystal of the semiconductor layer is grown on the substrate with indentations formed thereon. FIG. 11 shows a substrate for forming an LED provided with a photonic crystal. Referring to FIG. 11, in a substrate 110 for forming an LED provided with a photonic crystal, recesses 111 are periodically formed in only a first region 112. The recesses 111 have to be formed in a lattice pattern having a period almost the same in length as the wavelength of light emitted from the LED. Therefore, typically, this formation has to be conducted using an electron beam lithography or the like, and in order to increase the productivity for the substrate, it is necessary to reduce the lithography area as small as possible. Because of this, no recesses are formed in a second region 113 provided around the first region 112, so that the surface of the second region 113 is flat.

When an epitaxial layer 114 of GaN or the like is grown on the first region 112 and the second region 113, the epitaxial layer 114 is grown separately on the top of the first region 112 and the top of the second region 113, which causes a problem of discontinuous crystal growth. This is because the first region 112 periodically formed with the recesses 111 has a higher probability of occurrence of growth nuclei than the flat second region 113 and thus the probability of occurrence of growth nuclei discontinuously varies at the boundary between the first region 112 and the second region 113. The reason why the first region 112 has a higher probability of occurrence of growth nuclei than the second region 113 is that, for example, in the first region 112, the recesses 111 shorten the length of diffusion of the source material and block gas diffusion and that the ratio between group-V element and group-III element differs between the recess region and the flat region.

Moreover, around the boundary between the first region 112 and the second region 113 at which the probability of occurrence of growth nuclei discontinuously varies, abnormal growth of the epitaxial layer occurs to disadvantageously increase the thickness thereof. The thickness of the resulting epitaxial layer in the boundary region is about twice those in the first region 112 and in the second region 113.

If the thickness of the epitaxial layer after the crystal growth is ununiform, then a photoresist cannot be applied uniformly in a process after the crystal growth and the adhesion is degraded in a bonding process. The same problem also arises in the case where the first region 112 is formed with protrusions instead of the recesses 111.

An object of the present invention is to solve the problem, found by the inventors, of discontinuous crystal growth and resulting abnormal crystal growth around the boundary between a region provided with indentations and a flat portion of a substrate to be formed with a photonic crystal or the like, and to provide a semiconductor device in which a flat crystal-growth film is formed on a substrate selectively provided with indentations and a fabrication method of the device.

To attain the above object, the present invention is designed so that a semiconductor device is provided with a substrate having a smoothly varying probability of occurrence of growth nuclei.

To be more specific, a semiconductor device according to the present invention is characterized in that the device comprises: a substrate including a first indentation region and a second indentation region, the first indentation region being provided in a main surface thereof and formed with first recesses or protrusions, the second indentation region being provided to adjoin the first indentation region, formed with second recesses or protrusions, and having a lower probability of occurrence of growth nuclei than the first indentation region in the case where a crystal of a semiconductor is grown on the main surface; and a semiconductor layer formed on the substrate.

With the semiconductor device according to the present invention, the probability of occurrence of growth nuclei can be changed smoothly in the substrate. Moreover, a crystal of a semiconductor can be grown continuously across the first indentation region and the second indentation region. Furthermore, abnormal growth of the semiconductor does not occur on the side of the first indentation region in contact with the second indentation region. As a result, a semiconductor device including a flat, uniform semiconductor layer can be provided.

Preferably, in the semiconductor device of the present invention, the substrate includes a flat region which is provided in a portion of the main surface located on the side of the second indentation region opposite from the first indentation region, and in the substrate, the second indentation region has a higher probability of occurrence of growth nuclei than the flat region. With this structure, a crystal of a semiconductor can be grown continuously across the first indentation region, the second indentation region, and the flat region.

Preferably, in the semiconductor device of the present invention, the density of the second recesses or protrusions in the second indentation region is lower than the density of the first recesses or protrusions in the first indentation region. With this structure, the probability of occurrence of growth nuclei in the second indentation region can be made smaller than that in the first indentation region.

Preferably, in the semiconductor device of the present invention, in the second indentation region, the density of the second recesses or protrusions is higher in an area located on the side thereof in contact with the first indentation region than in an area located on the opposite side from that area. With this structure, the probability of occurrence of growth nuclei can be changed more smoothly.

Preferably, in the semiconductor device of the present invention, the first recesses or protrusions are arranged in a lattice pattern, and the second recesses or protrusions are arranged in a lattice pattern having a longer arrangement period than the lattice pattern with the first recesses or protrusions arranged therein. With this structure, the density of the second indentations can be certainly made smaller than the density of the first indentations.

Preferably, in the semiconductor device of the present invention, the first recesses or protrusions are arranged in a lattice pattern, and the second recesses or protrusions are arranged at lattice points of a lattice pattern other than randomly-selected ones, respectively, the lattice pattern having the same period as the lattice pattern with the first recesses or protrusions arranged therein. With this structure, the density of the second indentations can be certainly made smaller than the density of the first indentations.

Preferably, in the semiconductor device of the present invention, the diameters of the second recesses or protrusions are smaller than the diameters of the first recesses or protrusions. With this structure, the probability of occurrence of growth nuclei in the second indentation region can be made smaller than that in the first indentation region.

Preferably, in the semiconductor device of the present invention, the diameters of the second recesses or protrusions are larger in an area of the second indentation region located on the side thereof in contact with the first indentation region than in an area located on the opposite side from that area. With this structure, the probability of occurrence of growth nuclei can be changed more smoothly.

Preferably, in the semiconductor device of the present invention, the first recesses or protrusions are first recesses, the second recesses or protrusions are second recesses, and the depths of the second recesses are equal to or smaller than the depths of the first recesses, and in the second indentation region, the depths of the second recesses are smaller in an area located on the side thereof in contact with the first indentation region than in an area located on the opposite side from that area. With this structure, the probability of occurrence of growth nuclei in the second indentation region can be made smaller than that in the first indentation region.

Preferably, in the above case, the second recesses have tapered shapes in which the upper diameters are larger than the bottom diameters, respectively. With this structure, the second recesses can be filled easily with the semiconductor layer.

Preferably, in the semiconductor device of the present invention, the first recesses or protrusions are first protrusions, the second recesses or protrusions are second protrusions, and the heights of the second protrusions are equal to or smaller than the heights of the first protrusions, and in the second indentation region, the heights of the second protrusions are smaller in an area located on the side thereof in contact with the first indentation region than in an area located on the opposite side from that area.

Preferably, in the above case, the second protrusions have tapered shapes in which the upper diameters are smaller than the bottom diameters, respectively.

A method for fabricating a semiconductor device according to the present invention is characterized in that the method comprises: the step (a) of forming a substrate which includes a flat region provided in a main surface thereof, a first indentation region provided in a portion of the main surface different from the flat region and having first recesses or protrusions, and a second indentation region provided between the first indentation region and the flat region, formed with second recesses or protrusions, and having a lower probability of occurrence of growth nuclei than the first indentation region and a higher probability than the flat region in the case where a crystal of a semiconductor is grown on the main surface; and the step (b) of growing a crystal of a semiconductor layer on the substrate.

With the method for fabricating a semiconductor device according to the present invention, a flat, uniform semiconductor layer with a high crystallinity can be formed on the substrate formed with the indentations. Therefore, a semiconductor device employing the uniform semiconductor layer with a high crystallinity and also employing the indentations can be provided easily.

Preferably, in the method for fabricating a semiconductor device according to the present invention, the step (a) is the step of etching the first indentation region and the second indentation region using different masks to form the first recesses or protrusions and the second recesses or protrusions, respectively, and the first recesses or protrusions and the second recesses or protrusions are formed so that the density of the second recesses or protrusions in the second indentation region is lower than the density of the first recesses or protrusions in the first indentation region.

Preferably, in the method for fabricating a semiconductor device according to the present invention, the step (a) is the step of etching the first indentation region and the second indentation region using different masks to form first recesses and second recesses, respectively, and the second recesses are formed so that the depths of the second recesses are equal to or smaller than the depths of the first recesses and that in the second indentation region, the depths of the second recesses are smaller in an area located on the side thereof in contact with the first indentation region than in an area located on the side thereof in contact with the flat region.

Preferably, in the method for fabricating a semiconductor device according to the present invention, the step (a) is the step of etching the first indentation region and the second indentation region using different masks to form first protrusions and second protrusions, respectively, and the second protrusions are formed so that the heights of the second protrusions are equal to or smaller than the heights of the first protrusions and that in the second indentation region, the heights of the second protrusions are smaller in an area located on the side thereof in contact with the first indentation region than in an area located on the side thereof in contact with the flat region.

Preferably, the method for fabricating a semiconductor device according to the present invention further comprises, after the step (b), the step of removing the substrate. With this method, a photonic crystal can be formed on the surface of the semiconductor layer. Moreover, in the case where the device is a semiconductor light emitting diode, light absorption by the substrate can be prevented to further improve the light emission efficiency of the device.

The method for fabricating a semiconductor device according to the present invention may further comprise, after the step (b), the step of removing the flat region in the substrate.

BRIEF DESCRIPTION OF THE DRAWINGS

FIG. 1A is a plan view thereof, and FIG. 1B is a sectional view thereof taken along the line Ib-Ib in FIG. 1A.

FIG. 6A is a plan view thereof, and FIG. 6B is a sectional view thereof taken along the line VIb-VIb in FIG. 6A.

BEST MODE FOR CARRYING OUT THE INVENTION

First Embodiment

Figure 1A:
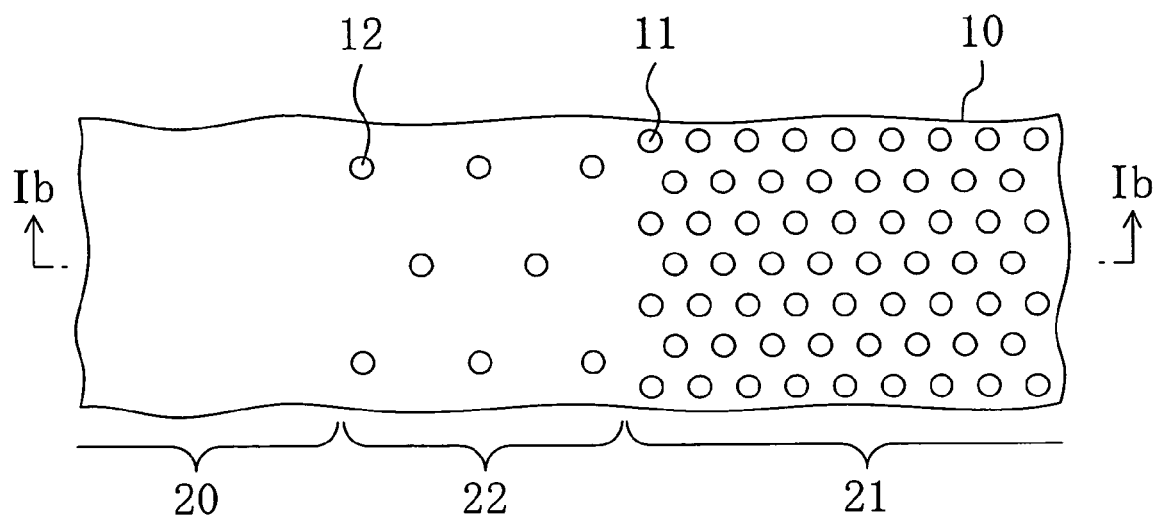
FIGS. 1A and 1B illustrate a substrate used in a semiconductor device according to a first embodiment of the present invention.
Figure 1B:
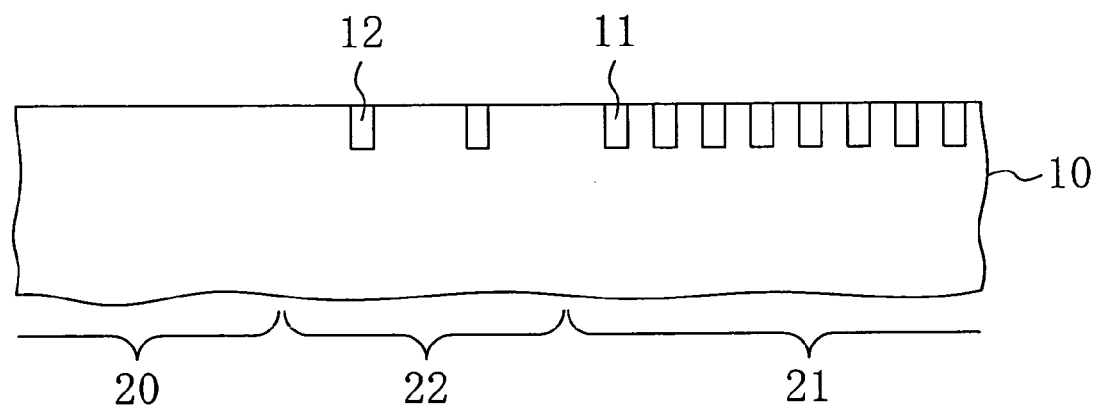

A first embodiment of the present invention will be described with reference to the accompanying drawings. FIGS. 1A and 1B illustrate a substrate for forming a semiconductor device according to the first embodiment. FIG. 1A shows a plan structure thereof, and FIG. 1B shows a cross-sectional structure thereof taken along the line Ib-Ib in FIG. 1A.

The main surface of a substrate 10 is provided with: a flat region 20; a first indentation region 21 formed with first recesses 11; and a second indentation region 22 located between the flat region 20 and the first indentation region 21 and formed with second recesses 12 having a lower density than the first recesses 11.

In the case of forming a photonic crystal, in the first indentation region 21, the first recesses 11 are formed in a lattice pattern having a period almost the same in length as the wavelength of light emitted from an LED. For example, for a general GaN-based LED with a wavelength of 450 nm, it is sufficient that the first recesses 11 are formed in a triangular lattice pattern having a period of about 400 nm.

Crystal growth proceeds in the manner in which growth nuclei are generated from products obtained by the reaction of a supplied source gas around the substrate and the generated growth nuclei grow two- or three-dimensionally into a crystal or the growth nuclei are polymerized with each other. If recesses are formed in the substrate, diffusion of the source gas and the reaction products is retarded. This raises the probability of occurrence of the growth nuclei, and thus the higher the density of the recesses is, the higher the probability of occurrence of the growth nuclei is.

In the substrate for forming the semiconductor device according to the first embodiment, in the second indentation region 22, the second recesses 12 are formed in a triangular lattice pattern having a period of 4000 nm, and the second recesses 12 have a lower density than the first recesses 11. Therefore, the probability of occurrence of the growth nuclei in the second indentation region 22 is lower than that in the first indentation region 21, and higher than that in the flat region 20. To be more specific, from the first indentation region 21 through the second indentation region 22 to the flat region 20, the probabilities of occurrence of the growth nuclei in these regions vary stepwise. This prevents crystal growth from proceeding separately in the first indentation region 21, the second indentation region 22, and the flat region 20. Moreover, this hinders abnormal growth of the crystal at the boundary portions between the first indentation region 21 and the second indentation region 22 and between the second indentation region 22 and the flat region 20. As a result of this, a uniform, flat crystal film can be provided.

Figure 2:
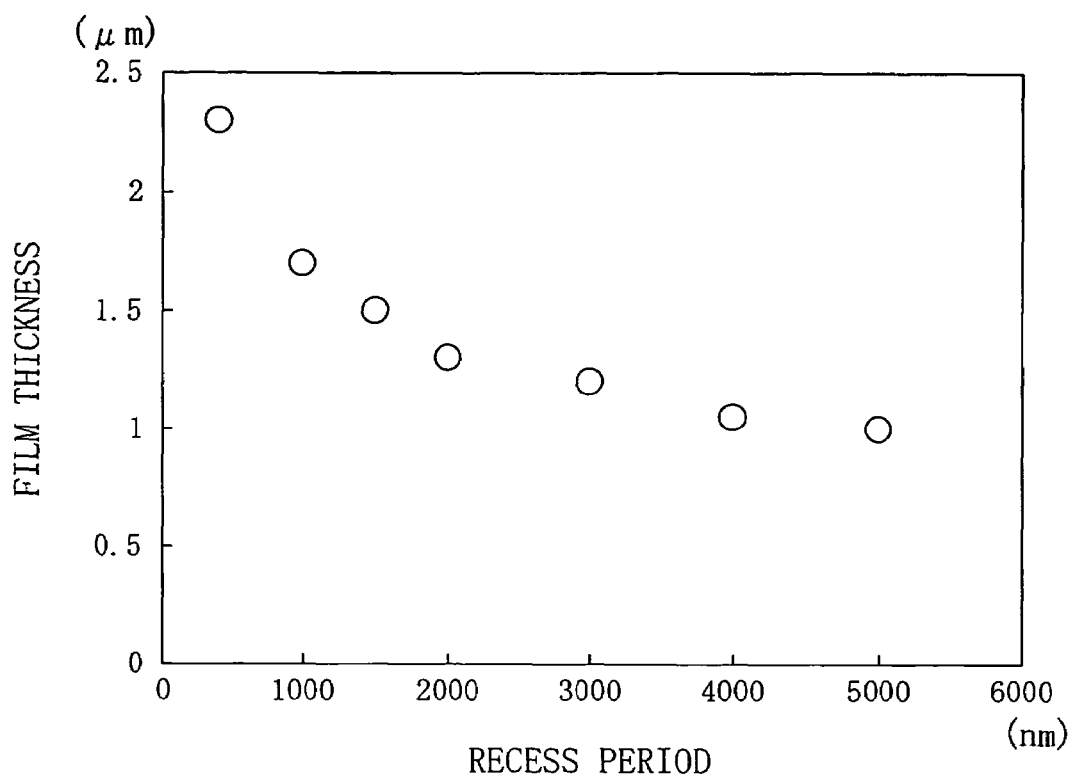
FIG. 2 is a graph showing the relation between the period of recesses formed in the substrate and abnormal growth of a semiconductor layer in the semiconductor device according to the first embodiment of the present invention.

FIG. 2 shows the result of measurement of the relation between the recess formation period and abnormal growth of a semiconductor layer. As the semiconductor layer, an AlGaN film of a thickness of 1 μm was grown by an MOCVD method on a substrate formed with recesses arranged in a fixed period. In FIG. 2, the abscissa axis represents the period of the recesses, while the ordinate axis represents the thickness of the film at the boundary portion between the recess formation region and the flat region. Note that sapphire was used for the substrate and each recess had a diameter of 200 nm and a depth of 150 nm.

Referring to FIG. 2, as the recess formation period becomes longer, the difference in thickness between the boundary portion and the other region decreases. This makes it difficult to cause abnormal growth at the boundary portion, thereby preventing film discontinuity. In order to uniformly apply a photoresist after the crystal growth, it is preferable to set the thickness difference therebetween at 300 nm or smaller to eliminate the film discontinuity and provide a continuously-formed film. Therefore, the period of the second recesses 12 is preferably 3000 nm or more.

On the other hand, if the difference in period between the second recesses 12 and the first recesses 11 becomes too big, abnormal growth occurs at the boundary portion between the first indentation region 21 and the second indentation region 22. Therefore, the period of the second recesses 12 is preferably 15 times or less the period of the first recesses 11.

In order to prevent abnormal growth, the width of the second indentation region 22 is preferably made as wide as possible. However, in consideration of an increase in the process time caused by formation of the second indentation region 22, it is sufficient that the width is set at about 50 μm.

Figure 3:
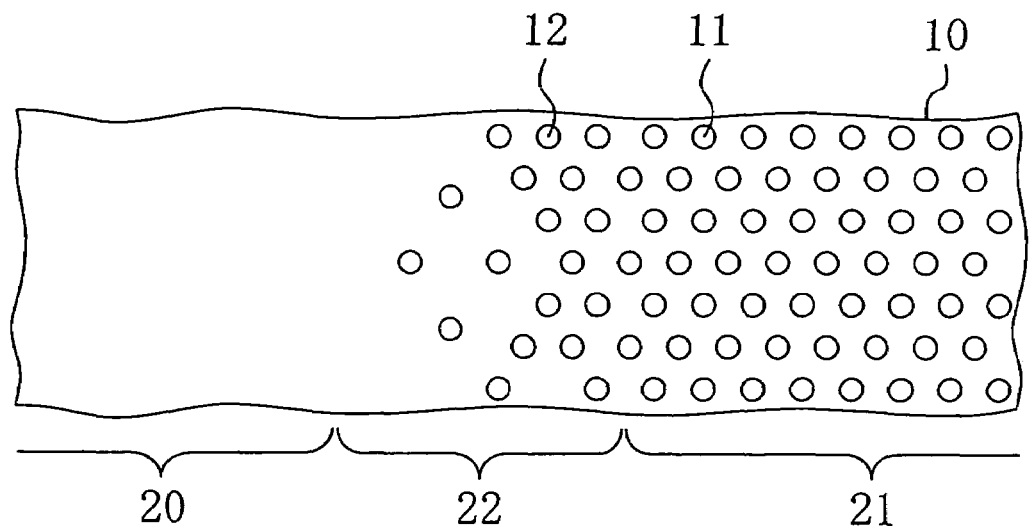
FIG. 3 is a plan view showing another example of the substrate used in the semiconductor device according to the first embodiment of the present invention.

In the second indentation region 22, the period of the second recesses 12 may be changed stepwise. For example, as shown in FIG. 3, in the second indentation region 22, the period of the second recesses 12 is changed step by step to 400 nm, 1000 nm, 1500 nm, 3000 nm, and 5000 nm in the direction from the first indentation region 21 to the flat region 20. Thereby, the probability of occurrence of the growth nuclei can be changed more continuously, so that the uniformity of the crystal film is improved. Furthermore, even if the period of the first recesses 11 is very short, a uniform crystal film can be provided.

Figure 4:
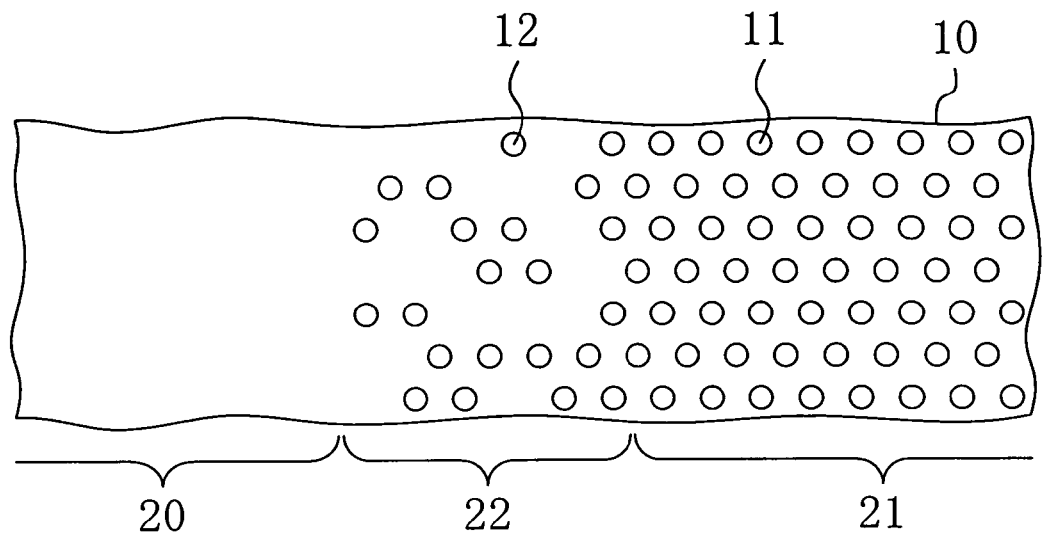
FIG. 4 is a plan view showing another example of the substrate used in the semiconductor device according to the first embodiment of the present invention.

In the first embodiment, the period of the second recesses 12 is made longer than the period of the first recesses 11, whereby the density of the second recesses 12 is made smaller than the density of the first recesses 11. Alternatively, as shown in FIG. 4, another approach may be employed in which the recess period itself is the same as that of the first recesses and the lattice points are randomly thinned out to lower the density of the recesses. In this case, the density of the second recesses 12 is preferably about one tenth to one fifteenth the density of the first recesses 11. The density may be changed gradually.

Figure 5:
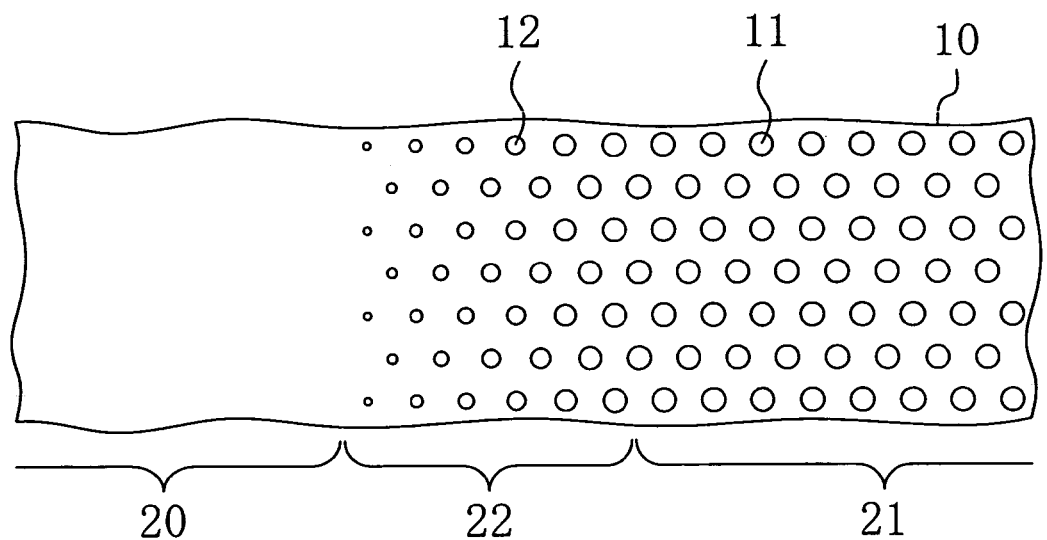
FIG. 5 is a plan view showing another example of the substrate used in the semiconductor device according to the first embodiment of the present invention.

Moreover, as shown in FIG. 5, the diameters of the second recesses 12 may be reduced to make the density of the second recesses 12 lower than the density of the first recesses 11. For example, in the second indentation region 22, the diameters of the second recesses 12 are reduced step by step to 200 nm, 150 nm, 100 nm, and 50 nm in the direction from the first indentation region 21 to the flat region 20.

The substrate of the first embodiment as described above can have the semiconductor layer with an excellent crystallinity formed on the first indentation region. Therefore, in a semiconductor light emitting diode (LED), a high electron mobility transistor (HEMT), a heterojunction bipolar transistor (HBT), or the like, the crystallinity of the semiconductor layer can be improved to enhance the performance of the device. In addition, if this embodiment is applied to an LED, the semiconductor layer can be formed on the first indentation region to facilitate formation of the photonic crystal.

Moreover, since the substrate is provided with the first indentation region and the second indentation region having a lower density of occurrence of the growth nuclei than the first indentation region, a uniform, flat semiconductor layer can be formed on the substrate. This facilitates photoresist application or the like in process steps after the growth of the semiconductor layer, which enables easy fabrication of the semiconductor device.

In the first embodiment, the recesses are formed in the first indentation region 21 and the second indentation region 22, but protrusions may be formed thereon. The formation of indentations in the substrate itself is exemplarily shown, but another approach may be employed in which an underlying layer is formed on a substrate and the underlying layer is formed with the indentations. The first recesses 11 and the second recesses 12 are arranged in a triangular lattice pattern, but they may be arranged in a tetragonal lattice pattern, a hexagonal lattice pattern, or the like. If it is desired to enhance the crystallinity of the semiconductor layer formed on the substrate, the first recesses 11 and the second recesses 12 may be arranged not in a lattice pattern but at random positions.

One Modification of First Embodiment

Figure 6A:
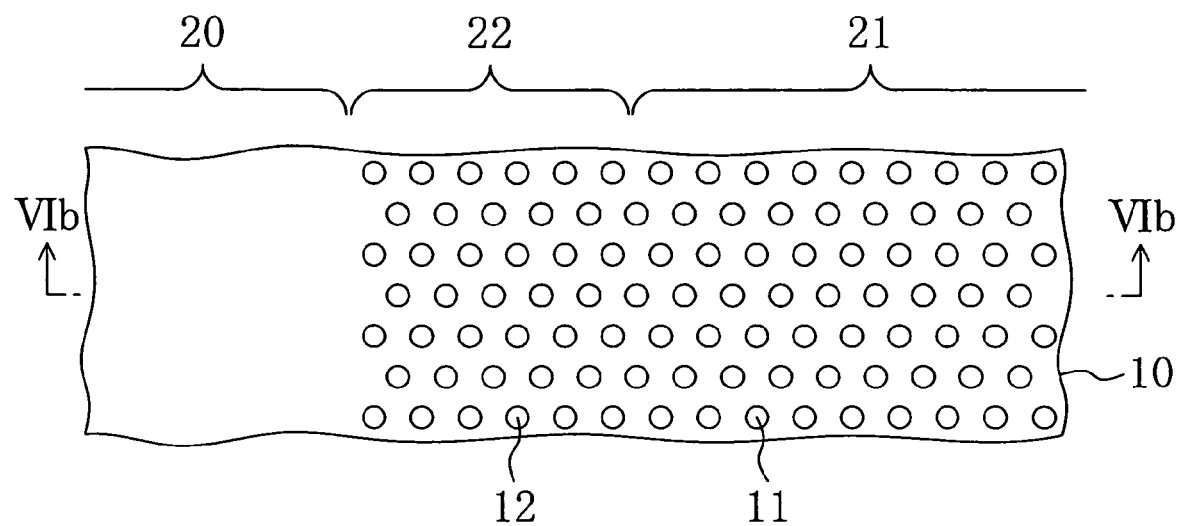
FIGS. 6A and 6B illustrate a substrate used in a semiconductor device according to one modification of the first embodiment of the present invention.
Figure 6B:
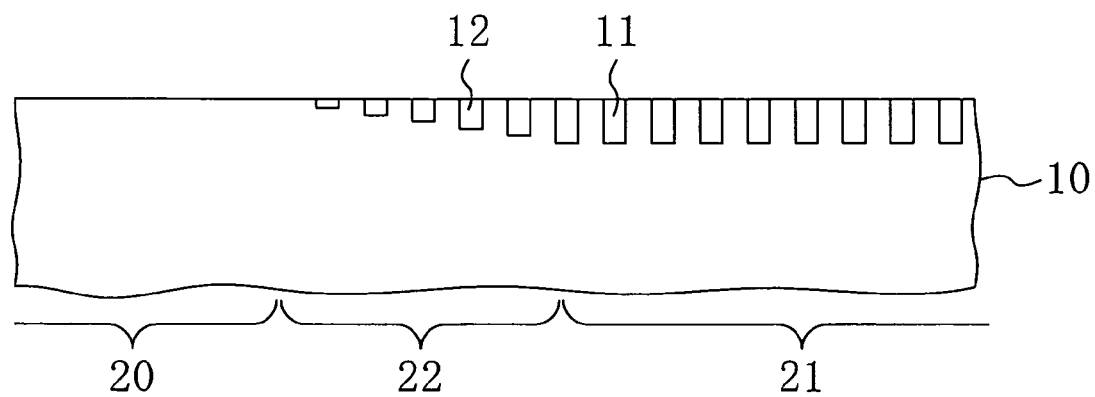

One modification of the first embodiment will be described below with reference to the accompanying drawings. FIGS. 6A and 6B illustrate a substrate for forming a semiconductor device according to one modification of the first embodiment. FIG. 6A shows a plan structure thereof, and FIG. 6B shows a cross-sectional structure thereof taken along the line VIb-VIb in FIG. 6A.

In the first embodiment, the density of the second recesses 12 is made smaller than the density of the first recesses 11, whereby the probability of occurrence of the growth nuclei in the second indentation region 22 is made smaller than that in the first indentation region 21. On the other hand, in this modification, the depth of each of the second recesses 12 is made smaller than the depth of each of the first recesses 11, whereby the probability of occurrence of the growth nuclei in the second indentation region 22 is made smaller than that in the first indentation region 21.

For example, in the second indentation region 22, the depths of the second recesses 12 are reduced step by step to 150 nm, 120 nm, 90 nm, 60 nm, and 30 nm in the direction from the first indentation region 21 to the flat region 20. The depth of each recess may be changed by adjusting the dose of electron beam to change the extent of sensitivity of a photoresist pattern.

Figure 7:
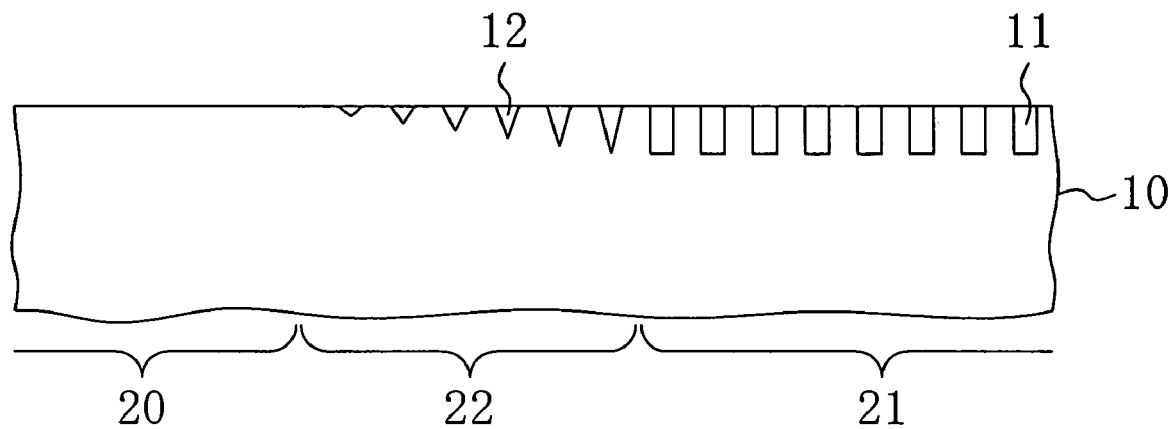
FIG. 7 is a sectional view showing another example of the substrate used in the semiconductor device according to one modification of the first embodiment of the present invention.

Moreover, as shown in FIG. 7, each of the second recesses 12 may have a tapered cross-sectional shape. By inclining the side wall of the second recess 12 toward the outside, a crystal can be grown smoothly on the top edge of the second recess 12 to form a more uniform crystal film. Herein, the second recess 12 having a V-shaped bottom surface is exemplarily shown, but the bottom surface thereof may be flat.

Also in this modification, protrusions may be formed instead of the recesses. As a substitute for formation of the indentations in the substrate itself, the following formation may be employed in which an underlying layer is formed on the substrate and then the underlying layer is formed with indentations.

Second Embodiment

Figure 8:
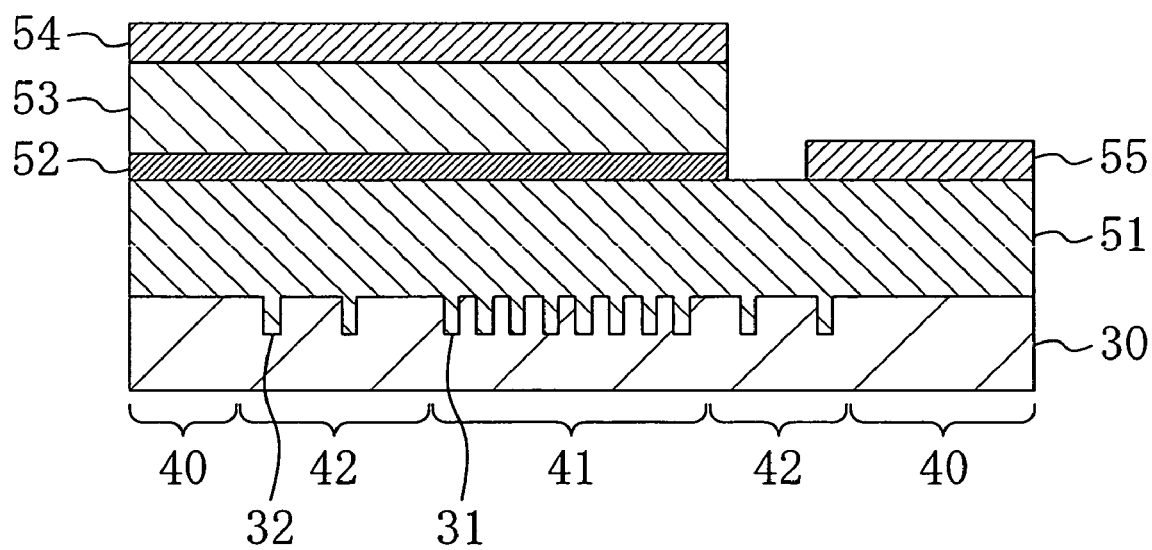
FIG. 8 is a sectional view showing a semiconductor device according to a second embodiment of the present invention.

A second embodiment of the present invention will be described below with reference to the accompanying drawings. FIG. 8 shows a cross-sectional structure of a semiconductor device according to the second embodiment. Referring to FIG. 8, the semiconductor device of the second embodiment is a light emitting diode (LED), and includes a substrate 30 made of sapphire and a semiconductor layer 50 formed on the substrate 30.

The substrate 30 is provided with: a flat region 40; a first indentation region 41 formed with first recesses 31; and a second indentation region 42 located between the flat region 40 and the first indentation region 41 and formed with second recesses 32 having a lower density than the first recesses 31. The first recesses 31 each have a diameter of 200 nm and a depth of 150 nm, and are arranged in a triangular lattice pattern having a period of 400 nm. The second recesses 32 each have a diameter of 200 nm and a depth of 150 nm, and are arranged in a triangular lattice pattern having a period of 4000 nm. The width of the second indentation region 42 is 50 μm.

The semiconductor layer 50 includes: an n-type GaN layer 51 formed on the substrate 30 and having a thickness of 4 μm; an InGaN active layer 52 having a thickness of 3 nm; and a p-type GaN layer 53 having a thickness of 200 nm. On the p-type GaN layer 53, a highly reflective p-side electrode 54 with a thickness of 1 μm is formed which is made by sequentially stacking platinum and gold. A portion of the n-type GaN layer 51 is exposed, and on the top of the exposed portion thereof, an n-side electrode 55 with a thickness of 1 μm is formed which is made by sequentially stacking titanium and gold.

Emitted light is taken out of the substrate 30 side of the device. Since the substrate 30 is provided with the first recesses 31 formed periodically, light emitted from the active layer 52 at a larger normal line angle than the critical angle of refraction relative to the interface between the n-type GaN layer 51 and the substrate 30 is also radiated from the device.

On the other hand, between the first indentation region 41 and the flat region 40, a second indentation region 42 is provided which is formed with the second recesses 32 having a lower density than the first recesses 31. Therefore, abnormal growth of the semiconductor layer 50 does not occur at the interfaces between the first indentation region 41 and the second indentation region 42 and between the second indentation region 42 and the flat region 40, whereby a flat, uniform semiconductor layer 50 can be provided. This enables uniform application of a photoresist on the semiconductor layer 50, so that after the crystal growth, an electrode formation process or the like can be carried out effectively.

In the second embodiment, the substrate 30 is employed in which the period of the second recesses 32 is made longer than the period of the first recesses 31. Even though another substrate described in the first embodiment or one modification of the first embodiment is employed, the same effects can be exerted. In addition, sapphire is employed for the substrate, but a substrate made of another material can also be employed as long as the material is transparent to light emitted from the active layer.

Third Embodiment

Figure 9:
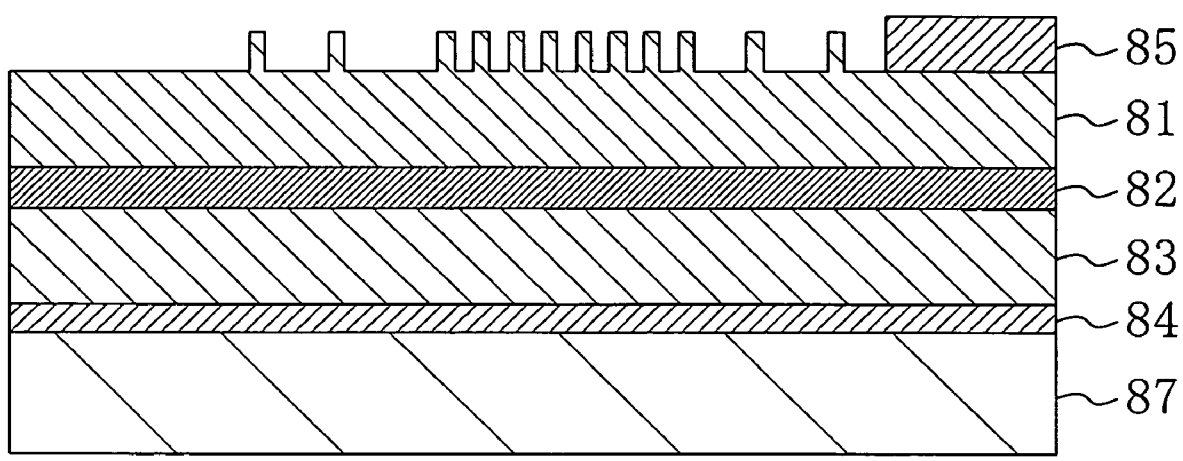
FIG. 9 is a sectional view showing a semiconductor device according to a third embodiment of the present invention.

A third embodiment of the present invention will be described below with reference to the accompanying drawings. FIG. 9 shows a cross-sectional structure of a semiconductor device according to the third embodiment. Referring to FIG. 9, the semiconductor device of the third embodiment is an LED having a photonic crystal formed on an emitting surface. Above a holding substrate 87, a semiconductor layer made by sequentially staking a p-type GaN layer 83, an InGaN active layer 82, and an n-type GaN layer 81 is held with a p-side electrode 84 interposed therebetween. On the n-type GaN layer 81, an n-side electrode 85 is formed, and photonic crystals each having a diameter of 200 nm and a height of 150 nm are arranged in a triangular lattice pattern having a period of 400 nm.

Figure 10A:
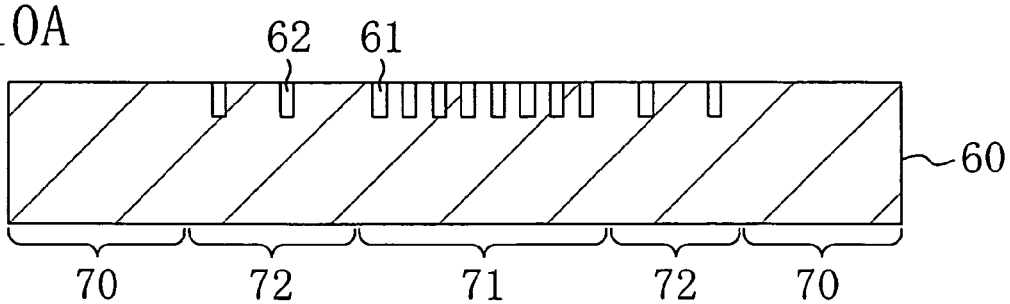
FIGS. 10A to 10D are sectional views showing a method for fabricating a semiconductor device according to the third embodiment of the present invention.

FIGS. 10A to 10D show a method for fabricating an LED with a photonic crystal according to the third embodiment in the order of its fabrication process steps. Referring to FIG. 10A, first, a first indentation region 71 and a second indentation region 72 are formed in a substrate 60 made of sapphire. In the first indentation region 71, first recesses 61 each having a diameter of 200 nm and a depth of 150 nm are formed therein in a triangular lattice pattern having a period of 400 nm. The second indentation region 72 is provided around the first indentation region 71 to have a width of 50 μm, and second recesses 62 each having a diameter of 200 nm and a depth of 150 nm are formed in a triangular lattice pattern having a period of 4000 nm. The first and second recesses 61 and 62 can be formed using an electron beam exposure method and a reactive ion etching (RIE) method. A region of the substrate located outside the second indentation region 72 is a flat region 70.

Figure 10B:
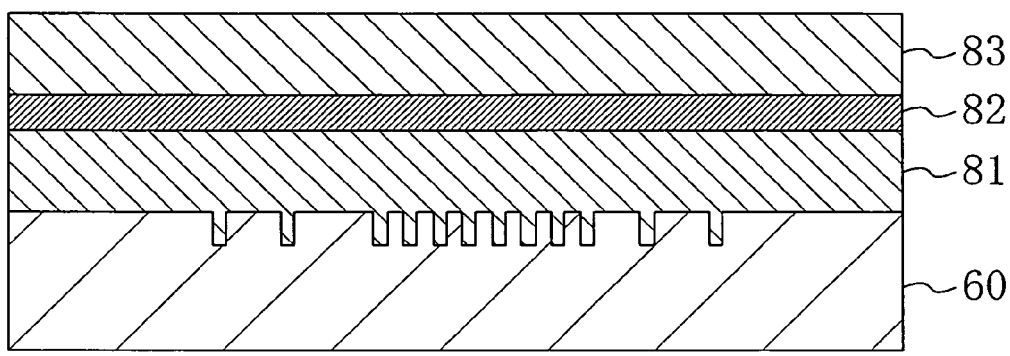

Next, as shown in FIG. 10B, on the substrate 60, crystals of the n-type GaN layer 81, the InGaN active layer 82, and the p-type GaN layer 83 are sequentially grown by a metal organic chemical vapor deposition (MOCVD) method.

Figure 10C:
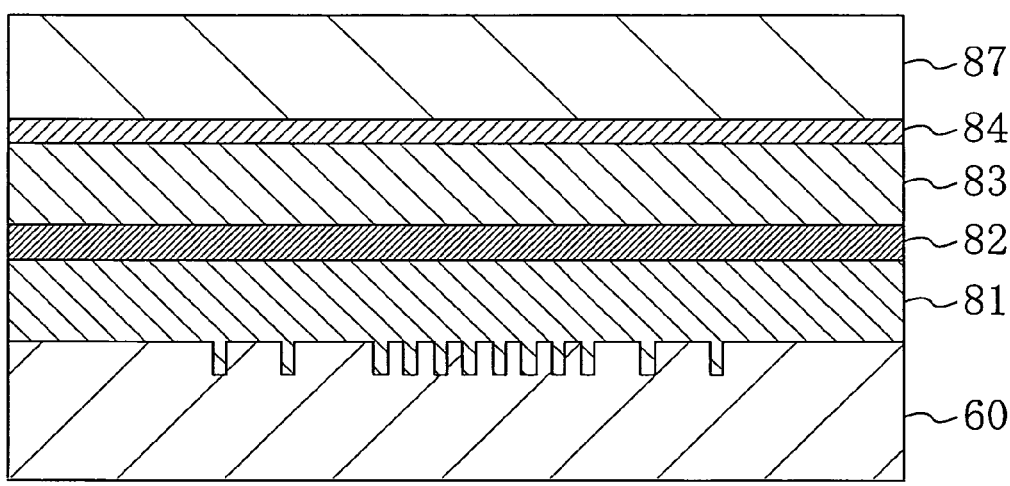

Subsequently, as shown in FIG. 10C, on the p-type GaN layer 83, the p-side electrode 84 with a thickness of 1 μm is formed which is made by sequentially stacking platinum and gold, and the holding substrate 87 with conductivity is stuck to the top of the p-side electrode 84.

Figure 10D:
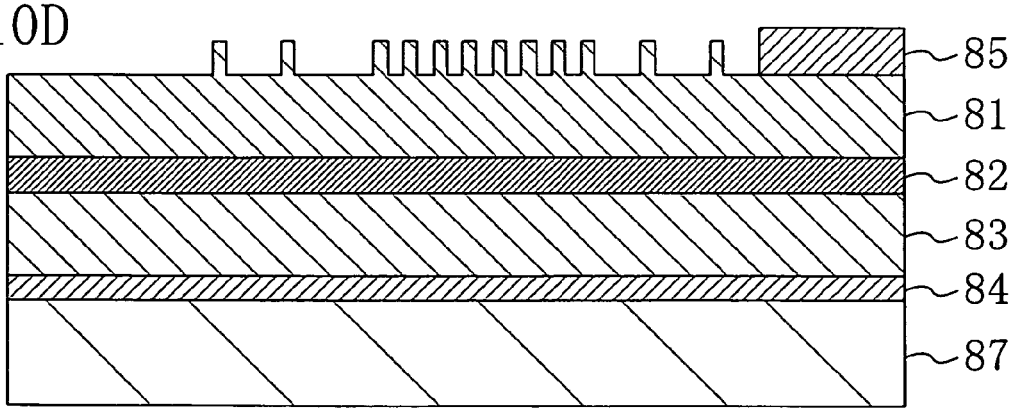
Figure 11:
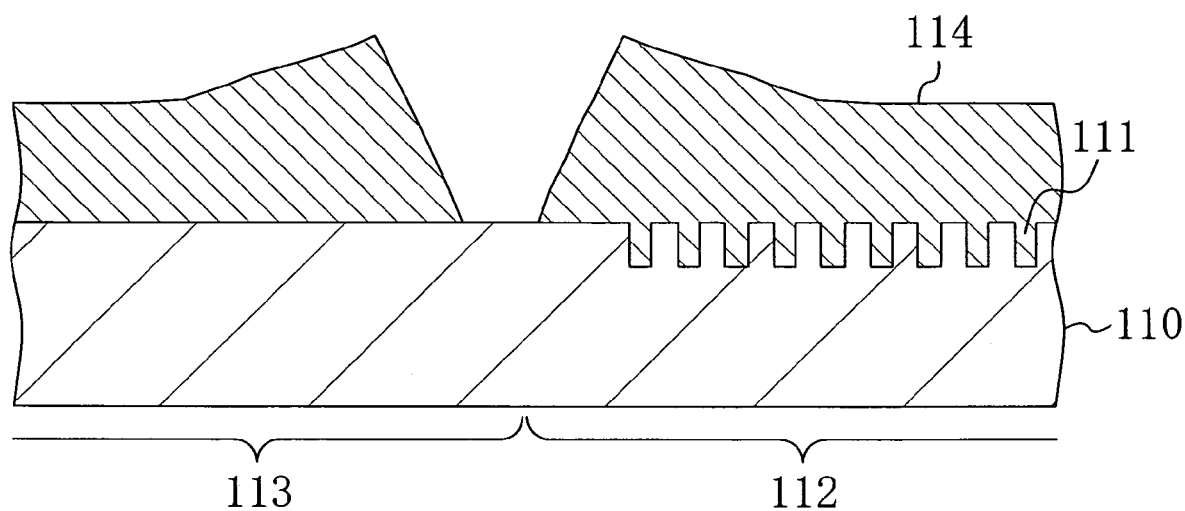
FIG. 11 is a sectional view showing the structure of a semiconductor layer formed on a conventional substrate, which is used to explain a challenge of the present invention.

Then, as shown in FIG. 10D, the substrate 60 is exfoliated. Thereby, a photonic crystal is exposed on the surface of the n-type GaN layer 81. The n-side electrode 85 made of titanium and gold is formed on the surface of the n-type GaN layer 81.

In the method for fabricating a semiconductor device according to the third embodiment, the n-type GaN layer 81 is grown on the substrate 60 periodically formed with the first recesses 61, and then the resulting substrate 60 is removed. Thereby, a photonic crystal can be formed easily. Moreover, between the flat region 70 and the first indentation region 71 formed with the first recesses 61, the second indentation region 72 is provided which is formed with the second recesses 62 having a lower density than the first recesses 61.

The probability of occurrence of growth nuclei decreases stepwise in the direction from the first indentation region 71 through the second indentation region 72 to the flat region 70. Therefore, a flat semiconductor layer can be grown on the substrate 60. Since, for example, the step of forming the p-side electrode 84 and the step of stacking the holding substrate 87 are the step of subjecting the flat surface to the target process, these steps can be carried out with high accuracy. As a result of this, an LED with excellent electric characteristics can be fabricated with high yield.

In the third embodiment, the substrate 60 is employed in which the period of the second recesses 62 is made longer than the period of the first recesses 61, but another substrate described in the first embodiment or one modification of the first embodiment may be employed. In addition, the recesses are exemplarily formed in the substrate, but protrusions may be formed thereon.

The embodiments mentioned above have been described exemplarily using a blue LED with a wavelength of 450 nm. Even if AlGaInN is used for an active layer and AlGaN is used instead of the n- and p-type GaN layers to fabricate an ultraviolet LED, the same effects as described above can also be exerted.

As described above, with the semiconductor device and its fabrication method according to the present invention, the flat crystal-growth film can be formed on the substrate selectively formed with the indentations. Accordingly, the present invention is useful for a semiconductor device, its fabrication method, and the like.

What is claimed is:

1. A semiconductor device comprising:
   a substrate and a semiconductor layer formed on the substrate,
   wherein the substrate includes:
      a first indentation region provided in a main surface thereof and formed with first recesses or protrusions;
      a second indentation region provided to adjoin the first indentation region, formed with second recesses or protrusions; and
      a flat region provided in a portion of the main surface located on the side of the second indentation region opposite from the first indentation region,
   the second indentation region has a lower probability of occurrence of growth nuclei than the first indentation region, and has a higher probability of occurrence of growth nuclei than the flat region, in the case where a crystal of a semiconductor is grown on the main surface, and
   the semiconductor layer is made flat at a boundary between the first indentation region and the second indentation region, and at a boundary between the second indentation region and the flat region.

2. The device of claim 1, wherein the density of the second recesses or protrusions in the second indentation region is lower than the density of the first recesses or protrusions in the first indentation region.

3. The device of claim 2, wherein in the second indentation region, the density of the second recesses or protrusions is higher in an area located on the side thereof in contact with the first indentation region than in an area located on the opposite side from that area.

4. The device of claim 1, wherein the first recesses or protrusions are arranged in a lattice pattern, and the second recesses or protrusions are arranged in a lattice pattern having a longer arrangement period than the lattice pattern with the first recesses or protrusions arranged therein.

5. The device of claim 1, wherein the first recesses or protrusions are arranged in a first lattice pattern, and the second recesses or protrusions are arranged at lattice points of a second lattice pattern other than randomly-selected lattice points, respectively, the second lattice pattern having the same period as the first lattice pattern.

6. The device of claim 1, wherein the diameters of the second recesses or protrusions are smaller than the diameters of the first recesses or protrusions.

7. The device of claim 6, wherein the diameters of the second recesses or protrusions are larger in an area of the second indentation region located on the side thereof in contact with the first indentation region than in an area located on the opposite side from that area.

8. The device of claim 1, wherein the first recesses or protrusions are first recesses, the second recesses or protrusions are second recesses, and the depths of the second recesses are equal to or smaller than the depths of the first recesses, and in the second indentation region, the depths of the second recesses are smaller in an area located on the side thereof in contact with the first indentation region than in an area located on the opposite side from that area.

9. The device of claim 8, wherein the second recesses have tapered shapes in which the upper diameters are larger than the bottom diameters, respectively.

10. The device of claim 1, wherein the first recesses or protrusions are first protrusions, the second recesses or protrusions are second protrusions, and the heights of the second protrusions are equal to or smaller than the heights of the first protrusions, and in the second indentation region, the heights of the second protrusions are smaller in an area located on the side thereof in contact with the first indentation region than in an area located on the opposite side from that area.

11. The device of claim 10, wherein the second protrusions have tapered shapes in which the upper diameters are smaller than the bottom diameters, respectively.

12. A method for fabricating a semiconductor device, comprising
the step (a) of forming a substrate and
the step (b) of growing a crystal of a semiconductor layer on the substrate,
wherein the substrate includes:
   a first indentation region provided in a main surface thereof and formed with first recesses or protrusions;
   a second indentation region provided to adjoin the first indentation region, formed with second recesses or protrusions; and
   a flat region provided in a portion of the main surface located on the side of the second indentation region opposite from the first indentation region,
the second indentation region has a lower probability of occurrence of growth nuclei than the first indentation region, and has a higher probability of occurrence of growth nuclei than the flat region, in the case where a crystal of a semiconductor is grown on the main surface.

13. The method of claim 12,
wherein the step (a) is the step of etching the first indentation region and the second indentation region using different masks to form the first recesses or protrusions and the second recesses or protrusions, respectively, and
the first recesses or protrusions and the second recesses or protrusions are formed so that the density of the second recesses or protrusions in the second indentation region is lower than the density of the first recesses or protrusions in the first indentation region.

14. The method of claim 12,
wherein the step (a) is the step of etching the first indentation region and the second indentation region using different masks to form first recesses and second recesses, respectively, and
the second recesses are formed so that the depths of the second recesses are equal to or smaller than the depths of the first recesses and that in the second indentation region, the depths of the second recesses are smaller in an area located on the side thereof in contact with the first indentation region than in an area located on the side thereof in contact with the flat region.

15. The method of claim 12,
wherein the step (a) is the step of etching the first indentation region and the second indentation region using different masks to form first protrusions and second protrusions, respectively, and
the second protrusions are formed so that the heights of the second protrusions are equal to or smaller than the heights of the first protrusions and that in the second indentation region, the heights of the second protrusions are smaller in an area located on the side thereof in contact with the first indentation region than in an area located on the side thereof in contact with the flat region.

16. The method of claim 12, further comprising, after the step (b), the step of removing the substrate.

17. The method of claim 12, further comprising, after the step (b), the step of removing the flat region in the substrate.

* * * * *

UNITED STATES PATENT AND TRADEMARK OFFICE
CERTIFICATE OF CORRECTION

PATENT NO. : 7,651,927 B2 Page 1 of 1
APPLICATION NO. : 11/604751
DATED : January 26, 2010
INVENTOR(S) : Yuji Takase It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 489 days.

Signed and Sealed this

Twenty-third Day of November, 2010

David J. Kappos
*Director of the United States Patent and Trademark Office*